United States Patent
Schneider

(10) Patent No.: US 7,564,383 B2
(45) Date of Patent: Jul. 21, 2009

(54) COMPRESSION RATIO OF ADAPTIVE COMPRESSION ALGORITHMS

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 87 days.

(21) Appl. No.: 11/948,954

(22) Filed: Nov. 30, 2007

(65) Prior Publication Data

US 2009/0140893 A1 Jun. 4, 2009

(51) Int. Cl.
*H03M 7/30* (2006.01)
(52) U.S. Cl. .......................... 341/107; 341/51
(58) Field of Classification Search .......... 341/50, 341/51, 107
See application file for complete search history.

(56) References Cited

U.S. PATENT DOCUMENTS 5,867,114 A * 2/1999 Barbir ......................... 341/107
6,233,674 B1 * 5/2001 Elnozahy ..................... 712/227
7,283,591 B2 * 10/2007 Ruehle ......................... 341/67

OTHER PUBLICATIONS

U.S. Appl. No. 11/948,958, Office Action dated Jan. 12, 2009, 7 pages.
U.S. Appl. No. 11/948,957, Office Action dated Dec. 23, 2008, 6 pages.

* cited by examiner

*Primary Examiner*—Howard Williams
(74) *Attorney, Agent, or Firm*—Blakely, Sokoloff, Taylor & Zafman LLP

(57) ABSTRACT

The performance (compression ratio) of an entropy coding compressor can be improved by separating its output into two streams: encoded output symbols compressed according to a probability model, and literal symbols that were not present in the probability model when the corresponding input symbol was to be encoded. The literal symbols are collected into a group and compressed separately. The compressed literals are stored at a discernable place relative to the encoded output symbols (e.g., at the beginning or end of the sequence of encoded output symbols).

20 Claims, 8 Drawing Sheets

COMPRESSION RATIO OF ADAPTIVE COMPRESSION ALGORITHMS

FIELD

The invention relates to data compression. More specifically, the invention relates to improving the compression ratio achieved by members of the known class of adaptive entropy coding compression algorithms.

BACKGROUND

Data compression can be used to write all of human knowledge on a pin (in theory, at least). Here's how: take a pin (FIG. 3, 300) and divide it into twenty-six segments (one segment for each letter, from A to Z). Make a mark 310 along the pin, in the segment corresponding to the first letter of all of human knowledge. In this example, the first letter is 'T'. It doesn't matter where in the 'T' segment the mark is made; anywhere between the end of 'S' and the beginning of 'U' is fine. The pin now contains the first letter of all of human knowledge.

Next, divide the 'T' segment into twenty-six segments (expanded view 320, showing the subdivided 'T' segment, the preceding 'S' segment 330 and following 'U' segment 340). Adjust the mark 350 so that it falls somewhere in the segment corresponding to the second letter of all human knowledge. In this example, the second letter is 'H'.

Repeat this process to encode the rest of the letters of all human knowledge. Doubly-expanded view 360 shows the 'H' segment, between 'G' 370 and 'I' 380, where the mark 390 has been adjusted to indicate that the third letter of all human knowledge is 'E'. Note that this procedure only works to write on the side of the pin. Writing on the head of a pin requires a different technique.

To recover the message written on the pin, one simply measures—very, very carefully—how far along the pin the mark is located, and works through the same segment-dividing method to extract the message. Since so much information (all human knowledge!) is encoded in a single mark on the pin, the information has been compressed.

In the real world, of course, the physical properties of matter prevent this method from being used to write more than a few letters on any reasonably-sized pin. However, there is no mathematical reason why ideal intervals cannot be subdivided indefinitely, and the foregoing method is a simplified form of entropy encoding compression, a viable and effective way of compressing data.

Traditional entropy encoding compression algorithms (such as Huffman coding, adaptive Huffman coding or arithmetic coding) depend on having a statistical model of the input stream they are compressing. The more accurately the model represents the actual statistical properties of symbols in the input stream, the better the algorithm is able to compress the stream. Loosely speaking, the model is used to make a prediction about what input symbol will come next in the input stream. For example, if the input stream is English-language text, the model would assign a higher probability to the letter 'e' than to the letter 'Q' (usually). This corresponds physically to making the 'e' segment of the pin longer than the 'Q' segment.

The probability model can be static (i.e., unchanging for the duration of a compression process) or adaptive (i.e., evolving as the compressor processes the input data stream). The probability model can also take into account one or more of the most recently encountered input symbols to take advantage of local correlations. For example, in English text, encountering a letter 'Q' or 'q' in the input stream makes it more likely that the next character will be 'u'.

An adaptive model typically works by matching the current input symbol against its prediction context, and if it finds the current input symbol in its context, generating a code representing the particular probability range that the input symbol represents. For example, if the current input symbol is 'e' and the model predicts that the probability of 'e' is in the range 0.13 to 0.47, then the compressor would generate an output code representing that probability range. This corresponds, in the physical example, to adjusting the mark to fall within the noted range of the current sub-segment of the pin. Once the symbol is encoded, the compressor updates the probability model. This "code and update" cycle is repeated until there are no more input symbols to compress.

When the compressor encounters a new symbol for which its model has no prediction, it must do something else. What it does is encode a special "escape" symbol to signal to the decompressor that the next symbol is a literal value. This escape-and-literal output has two problems: first, since the literal value will be sent as a whole number of bits (e.g., eight bits), compression algorithms that can send symbols in fractional bits will lose a small amount of compression efficiency when a fractional bit is rounded up to a whole-bit boundary. Second, the fact that these escaped literal symbols failed to match the current probability model provides some residual information that could be used to compress the literals themselves. This compression opportunity is wasted if the literals are distributed throughout the compressed data stream wherever the unmatched symbols happen to appear. Compression algorithm modifications to plug these efficiency "leaks" may be able to improve overall compression performance.

BRIEF DESCRIPTION OF DRAWINGS

Embodiments of the invention are illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

DETAILED DESCRIPTION

Embodiments of the invention attempt to improve adaptive entropy coding compression methods by collecting literal symbols that would normally be emitted in the compressed data stream and collecting those symbols into a group. The literals are then compressed together and placed at a discernible location in the compressed stream (e.g., at the beginning or end of the stream, or before or after blocks of data processed together). Properties of the literals are examined in detail to show what literal compression approach is likely to be most effective. Finally, techniques for building compression and decompression contexts are described, and modifications to obtain further performance improvements are explained.

The following descriptions will make basic assumptions about the implementation environment within which an embodiment of the invention operates. Since data compression is often performed by a computer, typical binary-computer operations will be assumed. Data subjected to compression will be considered to be represented as a series of eight-bit symbols. The principles described are applicable to operations in other bases and data in other representations, but maintaining full generality in the descriptions would be more confusing than enlightening.

Figure 1:
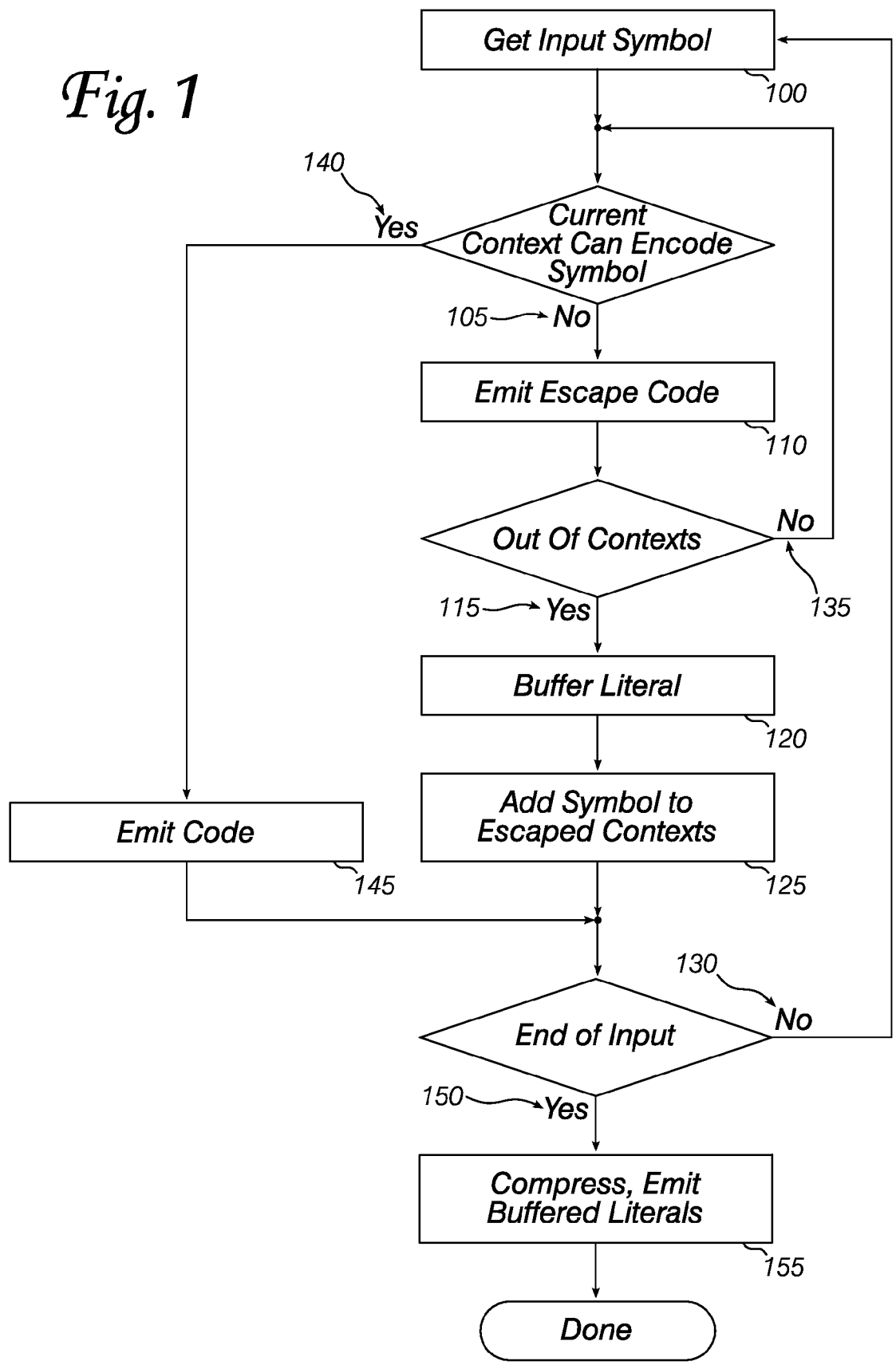
FIG. 1 shows an overview of an adaptive coding compression process according to an embodiment of the invention.
Figure 2:
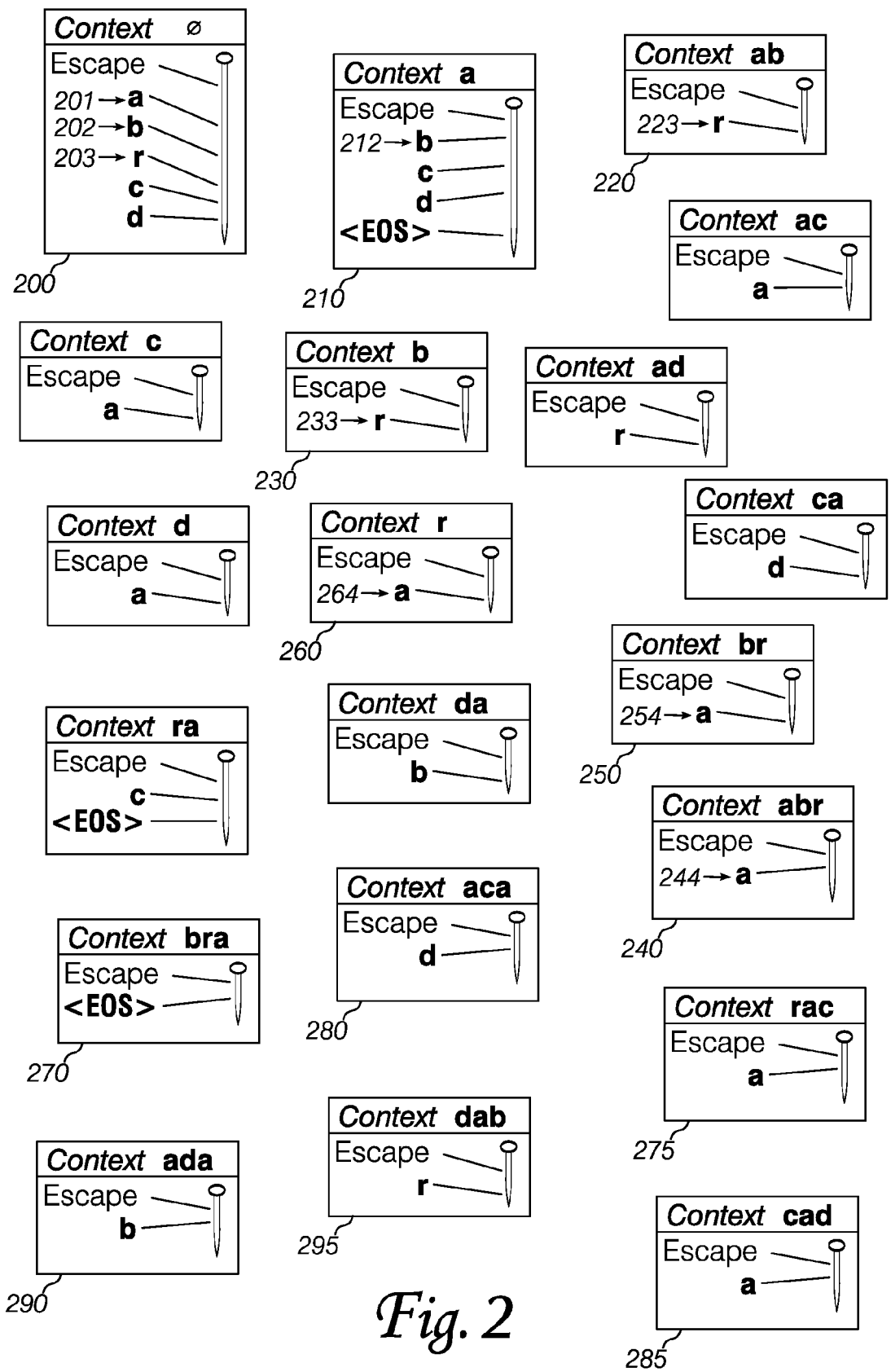
FIG. 2 shows the three-symbol contexts that are created as an embodiment of the invention compresses the string "abracadabra".

FIG. 1 outlines the operations of an adaptive entropy coding compressor including an embodiment of the invention. The following explanation will track the compressor through the flow chart as it processes an input string, "abracadabra". Compression can be thought of as building a model of the input data and picking a minimal set of clues about the model to send to a decompressor, so that the decompressor can replicate the model and reproduce the input string. FIG. 2 shows "contexts" of the model. Each context corresponds to symbols the compressor has recently encoded (or symbols the decompressor has recently recovered). The compressor examined in this example uses three-symbol contexts (i.e., each context corresponds to the three most-recently-encountered input symbols). Shorter contexts (two-character, one-character, and no-character contexts) also appear in the model. All the contexts together make up a probability model that, in some sense, represents estimates of the likelihood that a particular symbol will be seen at a certain point in the input.

Figure 3:
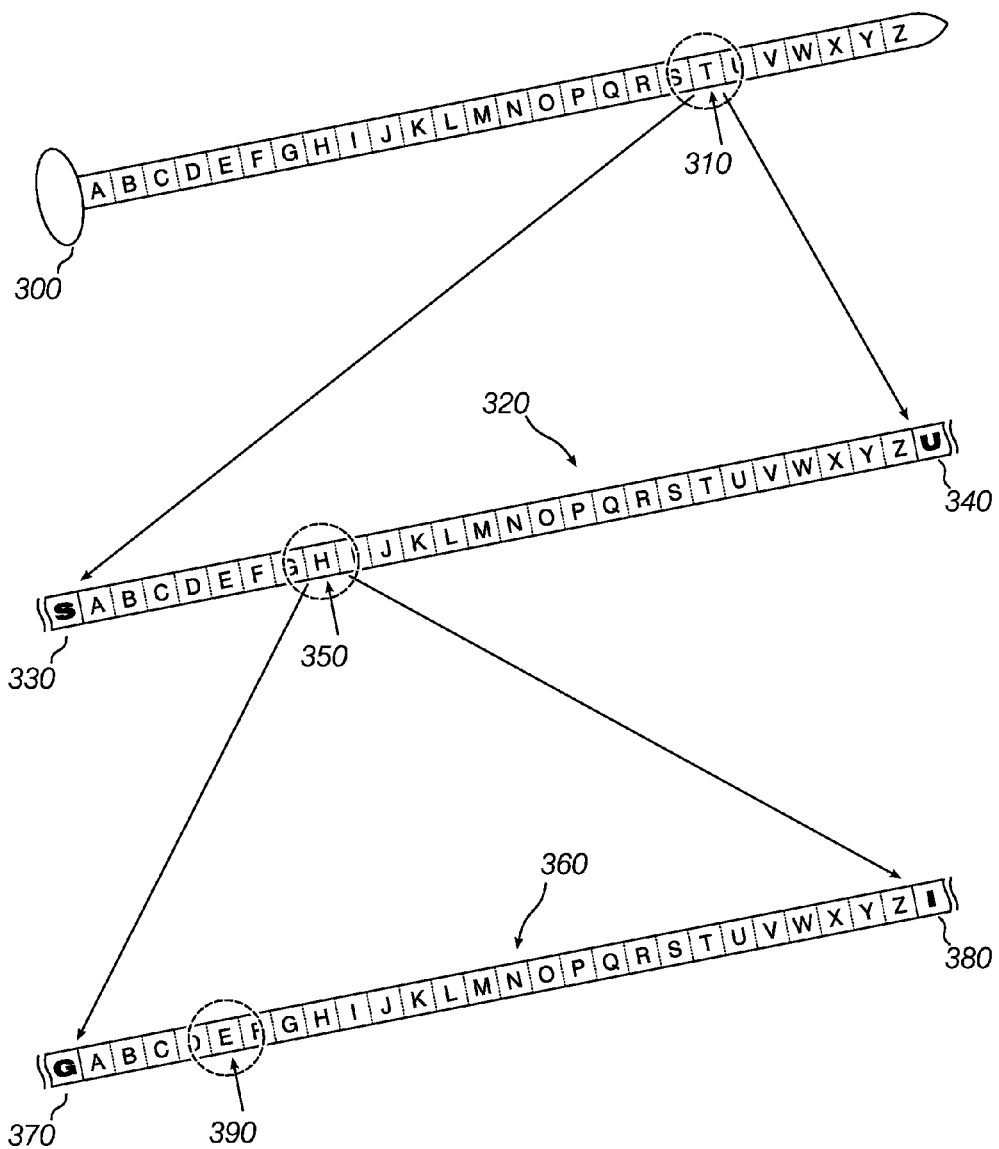
FIG. 3 shows a physical model suggesting how an entropy coding compressor works.

The information in a context can be thought of as a map to sub-segments of a part of a pin (as described in reference to FIG. 3). A fully-populated context would have entries giving the length of the pin-segment allocated to each corresponding input symbol. However, since this is an adaptive compressor, each context starts out empty (rather than divided into twenty-six segments for each letter, or 256 segments for each possible eight-bit symbol). As input symbols are encountered, contexts add segments and/or adjust the boundaries between segments so that the context can efficiently encode the input.

Although all of the contexts, and the symbols each can encode, are shown in FIG. 2, they accumulate over time (as described below). The model starts out empty, with the initial context 200 able to encode only an escape symbol. The escape symbol is distinct from the 256 possible symbols that could be present in a stream of eight-bit characters.

The compressor retrieves the first input symbol (100), a. The current context, 200, cannot (yet) encode a (105) so the compressor emits an escape token (110) and moves to a shorter context. Since context 200 is the shortest (zero-character) context, the compressor is out of contexts (115). It buffers the literal a (120) and adds a to each of the escaped contexts (125). (Element 201 indicates the a added to context 200.) The compressor has not reached the end of its input (130), so it loops back to get the next input symbol (100).

The next symbol is b, and the context is a (210). Since context 210 cannot (yet) encode b (105), the compressor emits an escape token (110) and moves to a shorter context. The next-shortest context is 200, so the compressor is not out of contexts (135) and loops back to consider context 200. Context 200 is also unable to encode b (105) (it can currently encode only escape and a), so the compressor emits another escape token (110) and moves to a shorter context. Again, context 200 is the shortest context, so the compressor is out of contexts (115). The literal, b, is buffered and also added to each escaped context (202, 212). So far, the compressor has emitted three escapes and buffered two literals. Only the escape from context 200 on input symbol b required any bits to encode; all the other escapes were from contexts that could only encode the escape. The physical analogue of this situation is a pin segment that can only encode one symbol: the mark could be anywhere along the whole segment and still convey the necessary information.

The next symbol is r and the context is ab (220). Context 220 cannot encode r (105), so the compressor emits an escape token (110) and moves to shorter context b (230). Context 230 also cannot encode r (105), so the compressor emits another escape token (110) and moves to shorter context 200. Context 200 cannot encode r (105), so the compressor emits another escape token (110) but is out of contexts (115). Literal r is buffered and added to contexts 200, 220 and 230 (see 203, 223 and 233). The end of the input has still not been reached (130), so the compressor loops back yet again.

For the next input symbol, a, the compressor starts at context 240 and escapes through 240, 250 and 260 (adding codings 244, 254 and 264) before discovering that context 200 can encode the input symbol (140). Therefore, the compressor emits the appropriate code (145) and loops back again.

The following table summarizes the activity of the compressor working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the compressor buffered a literal and updated one or more escaped-from contexts.

TABLE 1

| Symbol | Start Context | Escapes | Coding Context | Literal |
|---|---|---|---|---|
| a | 200 Ø | 1 | | a |
| b | 210 a | 2 | | b |
| r | 220 ab | 3 | | r |
| a | 240 abr | 3 | 200 | |
| c | 270 bra | 4 | | c |
| a | 275 rac | 3 | 200 | |
| d | 280 aca | 4 | | d |
| a | 285 cad | 3 | 200 | |
| b | 290 ada | 3 | 200 | |
| r | 295 dab | 3 | 200 | |
| a | 240 abr | | 240 | |
| <EOS> | 270 bra | 4 | | <EOS> |

After escaping from context 270 and buffering the end-of-stream literal, the compressor determines that the end of input has been reached (150). Now, it compresses the buffered literals and emits them in a discernible position relative to the encoded data bits (for example, at the beginning of the encoded stream, at the end of the stream, or at a block boundary in the stream). Concerns affecting the placement of the buffered, compressed literals are discussed below.

Several points are important to notice. First, the compressor must emit an enormous number of escapes—often three or four escapes for each input symbol. The escaped-from contexts have only a few different symbols that they can encode (the "pin segment" is divided into only a few, relatively large, sub-segments), so the escapes do not consume many output bits. However, one embodiment of the invention can often obtain an improvement in compression performance by coalescing multiple escape tokens into one "escape n times" token (where n is an integer). For example, context 240 might encode an "Escape-3" token, which would be used when the second a was encountered. In general, for an n-symbol context, an embodiment adds n+1 one-or-more-level escape tokens: Escape-1, Escape-2, . . . , Escape-n, Escape-n+1. The probabilities (pin-segment lengths) for each of these multilevel escape tokens are adjusted adaptively by the compressor and decompressor, just as are the probabilities for other symbols the context can encode.

Second, the <EOS> literal will be encountered exactly once, and will always be the last literal. Therefore, it often does not require any bits to encode (the decompressor can infer its existence and location from other information from the compressed stream). This also means that no literal symbol with more than eight bits will ever be produced, even if the input stream contains at least one symbol for each value.

Third, no other literal symbol will be emitted more than once. For an embodiment that deals with eight-bit symbols, a maximum of 256 literal symbols will be buffered, compressed and emitted. No literal will be repeated, so a compression algorithm that depends on repeated characters or sequences will be unable to compress the literals. However, the non-repeating property allows a compressor (and decompressor) to make certain inferences about the literals, which enable them to be encoded in fewer bits (i.e., to be compressed). Specifically, there are 257 different literal values (0-255 symbol values, plus an end-of-stream indicator). The first literal encountered in the stream will have a value between 0 and 255 (an end of stream indicator at this point means that the input is an empty stream, which can be most easily represented in "compressed" form as another empty stream). The second literal encountered can have one of 256 distinct values (either one of the other literal values, or the end of stream indicator), the third, one of 255 values, and so on. The $256^{th}$ literal can have one of two values—the last literal value that has not been seen, or the end of stream indicator. There is no need to code the $257^{th}$ literal: it can only be the end of stream indicator. Using this property that the number of as-yet unseen literals is always decreasing, the literals can be represented in a smaller number of bits than 256×8=2,048.

Specifically, denoting the base-2 logarithm function as $\log_2(\ )$ and the least integer greater than or equal to its argument function as ceil( ), it is trivial to show that the possible permutations of literals can be encoded in $$\mathrm{ceil}(\log_2(256)+\log_2(256)+\log_2(255)+\ldots+\log_2(2)) \quad \text{Eq. 1}$$

bits, or 1,692 bits (which is actually 211.5 eight-bit bytes, rounded up to 212). Input streams that use fewer than all input symbols can store all their literals in an even smaller number of bits.

Furthermore, the order that the literals appear in the buffered series is related to the probabilities of those literals appearing in the input data. Therefore, if the literal-compressor algorithm is preloaded with known or estimated probabilities, then its performance may improve. For example, if the input was English text, then preloading the literals compressor with the symbol distribution for English (e.g., 'e' more probable than 'Q') will improve the compression of the buffered literals. Alternatively, the probabilities determined by compressing/decompressing a previous stream may be retained for compressing the literals of a succeeding stream. For example, the literals from compressing "abracadabra" were "abrcd<EOS>". If the next stream is "abraham", the literals would be "abrhm<EOS>". Clearly, using information from the "abrcd<EOS>" literals would permit greatly improved compression for the "abrhm<EOS>" literals.

Figure 4A:
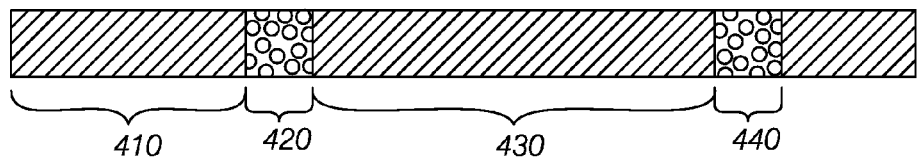
FIGS. 4A-4C show some possible formats for the compressed data.
Figure 4B:
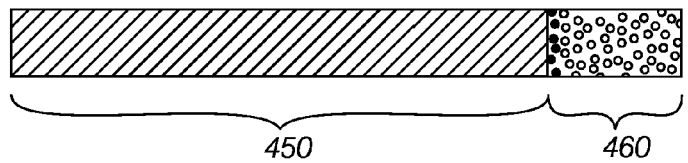
Figure 4C:
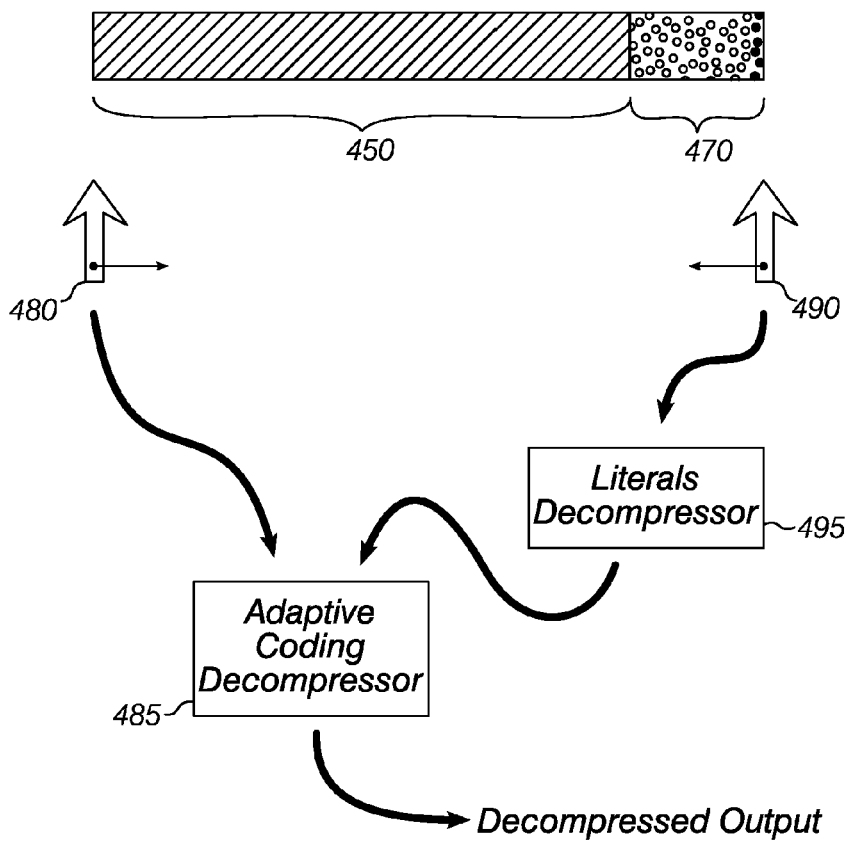

FIGS. 4A-4C illustrate potential formats of a compressed data stream. FIG. 4A shows how, in a prior-art compressor, a series of codes 410 is interrupted by a literal byte 420. The literal is followed by more codes 430, which are again interrupted by a second literal 440. The code sequences (410, 430) can be thought of as an extended binary fraction that expresses the location along a unit-length pin where the message mark lies. As explained above, literals 420 and 440 must be emitted at least a bit boundary, and more likely (for convenience) at a byte boundary. Thus, any fractional bits at the end of code sequences 410 and 430 are lost when a literal is emitted.

FIG. 4B shows how an embodiment of the invention improves this situation: a single, uninterrupted series of compressed codes 450 are followed by a block of compressed literals 460. Since compressed codes 450 are not interrupted, no fractional bits are lost. FIG. 4C shows a modification that improves handling of a compressed data stream prepared according to an embodiment of the invention. Compressed codes 450 are the same as in FIG. 4B, but the compressed literals 460 have been reversed, 470. (Note that the black-filled circles at the left of 460 are shown at the right of 470, indicating this reversal.) This permits the decompressor to read compressed codes using a file pointer 480 that advances to the right from the beginning of the stream, and to read compressed literals using a file pointer 490 that advances to the left from the end of the stream. Codes from pointer 480 are fed directly into adaptive coding decompressor 485, while compressed literals are passed to literals decompressor 495 before being supplied to adaptive coding decompressor 485. Decompressor 485 reconstructs the context model that the compressor built, and uses the decompressed literals and the context model to reconstitute the original input stream.

Figure 5:
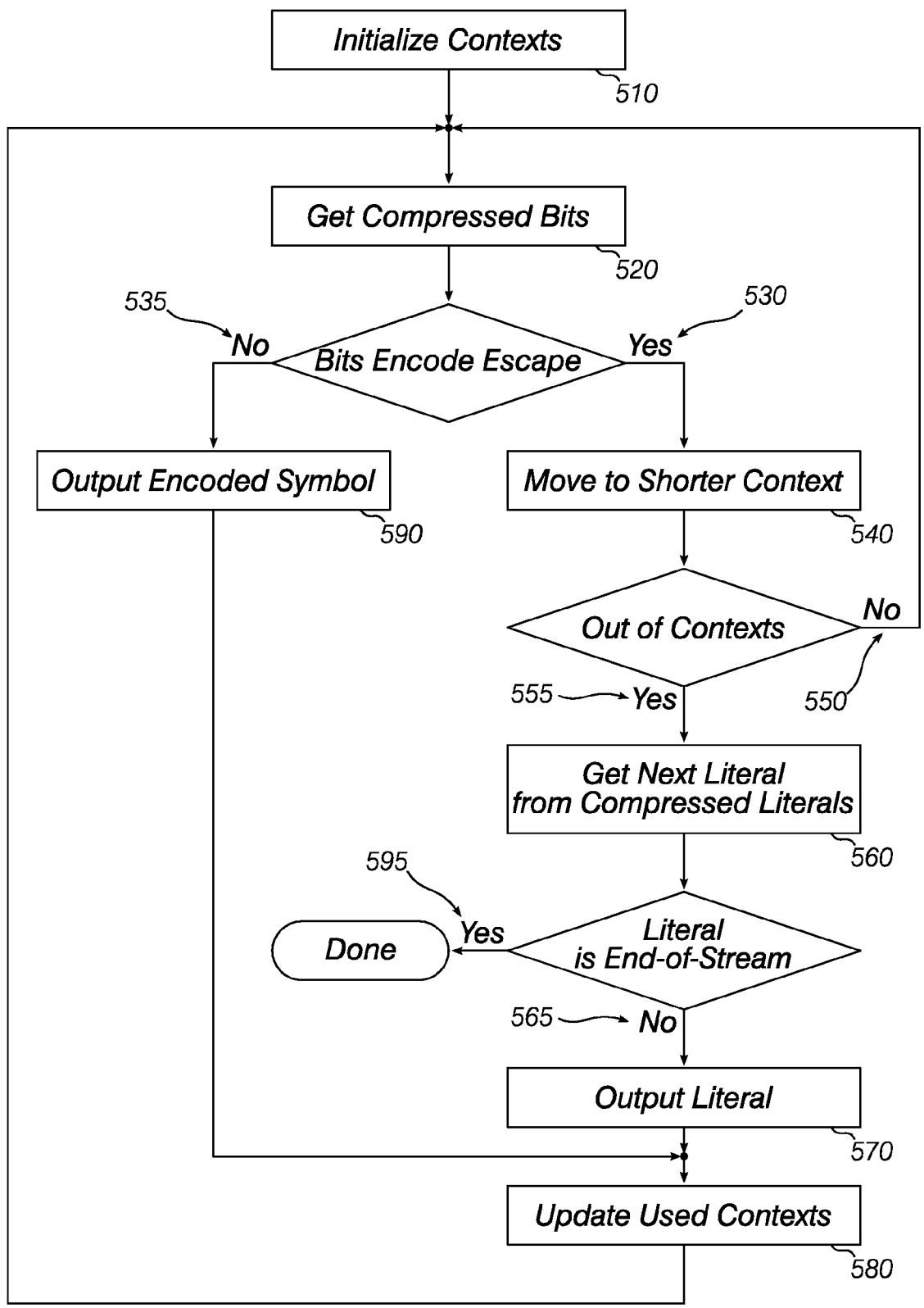
FIG. 5 is a flow chart outlining decompression according to an embodiment of the invention.

FIG. 5 is a flow chart outlining the operations of an entropy coding data decompressor according to an embodiment of the invention. The decompressor initializes its context model identically to the compressor's initialized model (510). Recall that despite the large number of contexts (shown in FIG. 2) that exist after compressing an input stream, the compressor and decompressor start with just one state, 200, that can encode just one symbol, escape.

Next, the decompressor gets some compressed bits from the compressed data stream. For example, it may read some data from file pointer 480 as shown in FIG. 4C. The number of compressed bits necessary to decide what to do next varies from time to time, depending on the state of the decompression context. For example, when decompression has just started and context 200 can only encode escape, no bits are required—the decompressor knows that the compressor must have emitted an escape, because that is the only thing it could emit. Consequently, the escape is encoded in zero bits.

Since the first compressed bits encode escape (530), the decompressor moves to a shorter context (540). However, since context 200 is already the shortest context, the decompressor is out of contexts (555) and requires a literal. It obtains the next literal from the literal decompressor (560), checks to ensure that it has not reached the end-of-stream (565) and outputs the literal as the reconstituted data (570). Referring to Table 1, it is clear that the first compressed literal was a, so that symbol is output.

Any contexts used (e.g., escaped from) are updated (580), and the decompressor loops back to get more compressed bits (520). (Again, no compressed bits have been used yet, because no existing context could encode anything except Escape.)

Now, the decompressor is in context 210, because it has just produced the symbol a. Context 210 is unable to encode any symbol except escape, so the decompressor again consumes zero bits to determine that the next encoded symbol is escape (530). Now, the decompressor moves to the next-shorter context (540), which is context 200. It is not out of contexts (550), so it loops back to get more compressed bits (520).

Context 200 currently encodes escape and a, so some information (at least a portion of a compressed bit) is required to decide which. This compressed bit encodes another escape (530). This is the third escape mentioned above in [0026]. The decompressor moves to a shorter context (540) and runs out of contexts (555), so it gets the next literal from the compressed literals (560), notes that it is not end-of-stream (565), and outputs it (570). Recall that the second literal produced during compression was b. The contexts escaped from (210, 200) are updated (580) and the decompressor loops back again.

This process continues until the characters abr have been recovered and output. The decompressor is in state 240 and gets some more compressed bits (520). States 240, 250 and 260 only encode escapes, so no bits are consumed as the decompressor escapes to shorter contexts. When it reaches context 240, it discovers that the next compressed bits encode a (535), so it outputs this symbol (590), updates the appropriate contexts (580) and loops back to process more compressed bits.

The decompressor continues working through the compressed bits, extracting literals as necessary from the compressed literals block, until there are no more compressed bits to examine. At this point, the original input symbol sequence has been reconstituted and emitted.

Note that the decompression process requires literals from the compressed block fairly early in its operations (in fact, the very first thing it does is infer an escape from zero compressed bits, extract a compressed literal and output it). Thus, it is important for the decompressor to have access to the compressed literals as soon as possible. If the decompressor has access to the entire compressed data stream, as shown in FIG. 4C, then it can use the dual-file-pointer method depicted to access the literals as necessary. However, if the decompressor is receiving the compressed data stream from a non-seekable source, it must buffer the data until it can determine where the compressed literals are.

Figure 6A:
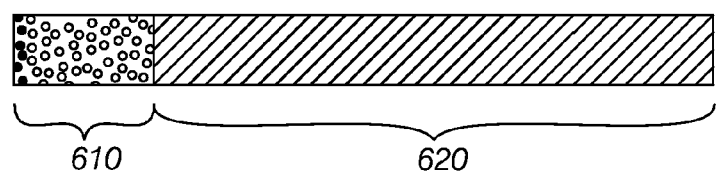
FIGS. 6A and 6B show two more compressed-data formats.

FIG. 6A shows another data layout that may be used to alleviate the buffering requirement. Here, the compressed literals are positioned at the beginning of the compressed data stream (at 610), ahead of the uninterrupted compressed symbols 620. This arrangement is the best because the decompressor has easy access to all the compressed literals and need not buffer its reconstituted output at all, but it requires the compressor to buffer the compressed symbols 620 until all but one of the possible literals have been seen (or until the input stream is exhausted). This may place an unsupportable burden on the compressor.

Figure 6B:
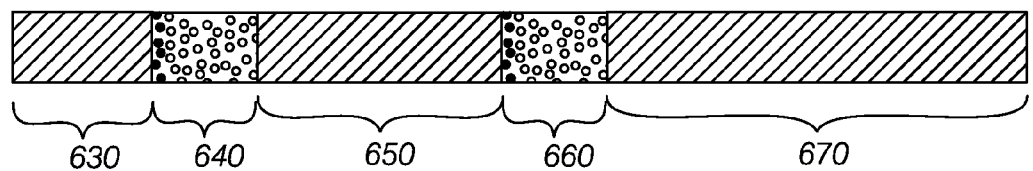

A third embodiment, shown in FIG. 6B, represents a compromise between forcing either the compressor or decompressor to buffer a large amount of compressed data (potentially, almost all the data), and wasting fractional bits by interrupting coded sequences with compressed literals. The compressor buffers the first portion of compressed codes, up to an even bit (or byte) boundary, or to a maximum buffer length. Any literals emitted to that point are compressed and sent to the output stream (630), followed by the first buffered portion of the compressed symbols (640). More input symbols are compressed and buffered, as are any further literals. When the second buffered codes reach a bit or byte boundary, or fill a maximum buffer length, the collected literals are again compressed and sent (650), ahead of the second buffer of codes (660). This structure repeats until all but one literal have been seen, compressed and sent, and then subsequent output codes (670) may be sent without buffering. In practical implementations of entropy coders, rather than work with arbitrary-precision binary fractions, most compressors and decompressors renormalize the working fraction when it becomes too small to be represented in the computer's natural integer size (e.g., 16 bits, 32 bits or 64 bits). When renormalization occurs, an even bit (or byte) boundary has been reached, so collected literals may be compressed and output.

This compromise runs the risk of losing a fraction of a bit for every block of compressed literals. For example, if the compressor emits a block of compressed literals at the first bit boundary in the output stream when there are 16 literals ready to be compressed and output, the compressed literals will occupy 1,700 total bits in the output—losing about 0.5 bits per block of literals.

If it is not possible to buffer enough data to arrange for all the compressed literals to appear at either the beginning or end of the compressed data, a reasonable fallback approach would be to accumulate enough literals to have more than a predetermined number of compressed-literal bits in each block of compressed literals. If the predetermined number was, say, 64, then no more than 27 compressed-literals blocks would be required, with the final block being 28 bits long. Each 64-or-greater-bit block would be emitted at the at the next bit or byte boundary in the encoded symbol stream, as discussed in reference to FIG. 6B.

In more general terms, embodiments of the invention can be thought of as separating the compressed output data stream of an adaptive coder into two parts: encoded symbols that were present in the coder's probability model, and literal symbols that were not present. Symbols that were not present may be added to the model during the "context update" phase of compression and decompression. The first part of the compressed data stream (the encoded symbols that were present in the model) contains only two types of information: encoded versions of input symbols, and encoded "escape" tokens. In some embodiments, all the escape tokens are semantically indistinguishable (each one means "go to the next-shorter context") although the bits used to encode them may change as the context model adapts. In other embodiments, multi-level escape tokens mean "go to the context that is n symbols shorter than the current context." Whenever the shortest (zero-symbol) context is escaped, it means "an input symbol that is not presently part of the model was encountered." However, the identity of the input symbol is not contained in the first part of the compressed data. To find out what input token was not in the model, one must refer to the literals that were collected, compressed separately, and emitted as the second part of the data output stream.

Embodiments of the invention achieve modest improvements in compression efficiency, as measured by the output data size compared to the input data size. For example, literals compression affects at most 256 output bytes—even if the literals compression was able to completely eliminate these bytes, rather than simply shrink them to 212 bytes (or perhaps somewhat fewer, if prior information is used in the compression), the number of saved bytes is small and has a proportionally diminishing effect as the size of the input grows. Placing the compressed literals together in a block, rather than dispersing them throughout the compressed data stream, prevents the waste of no more than 256 fractional bits. Even assuming that each wasted fractional bit was actually a complete bit, blocking the compressed literals can save no more than 32 output bytes. The effect of multi-level escapes is more difficult to assess, because single-level escapes can often be encoded with zero bits, while the availability of several different types of escapes means that any particular escape may require some fraction of a bit to be represented. In any case, as the input data size grows, the compressor's model fills in and escapes become less common. Eventually, for a large and varied data set, every context will have a prediction for every symbol, and no more escapes will be generated. Thus, again, the effect of various embodiments of the invention diminishes with increasing input data set size.

However, the compression ratio improvements offered by an embodiment of the invention are not insignificant or diminishing in certain applications. When the compressor must process many independent, moderately-sized blocks, all of the techniques are producing their gains. Many or most literals are typically generated near the beginning of a compression session. A proportionally larger number of escapes are also generated as the contexts fill up. Furthermore, with moderately-sized blocks, the compressor and decompressor are quite likely to be able to buffer the complete input stream, so all the compressed literals can be placed together at the beginning or end of the block, rather than distributed in chunks throughout the input. Also, in many applications, although the individual blocks must be processed independently, there are similarities in data symbol distributions, so the literals compression algorithm can capitalize on probabilities learned from processing other blocks, although the blocks are independent. Therefore, embodiments of the invention may be most useful in processing a large number of independent blocks of modest size (e.g., 512 bytes to 16,384 bytes). (These sizes do not represent a fixed range, outside of which embodiments are not useful, but rather suggest a size range where embodiments are most likely to repay the increased computational costs with correspondingly improved compression ratios.)

Applications where a large number of independent, moderately-sized data blocks are processed, and which may benefit from improved compression of those blocks include: block level compression for hard disks (disk block sizes typically run from about 512 bytes to 4,096 bytes); network packet compression (network packet sizes typically run from 64 bytes to 1,536 or 2,048) bytes; and text messaging protocols such the Short Message Service ("SMS," where cellular message transmission is expensive). Instant Messaging ("IM") protocols and electronic mail transmission systems may also benefit.

Figure 7:
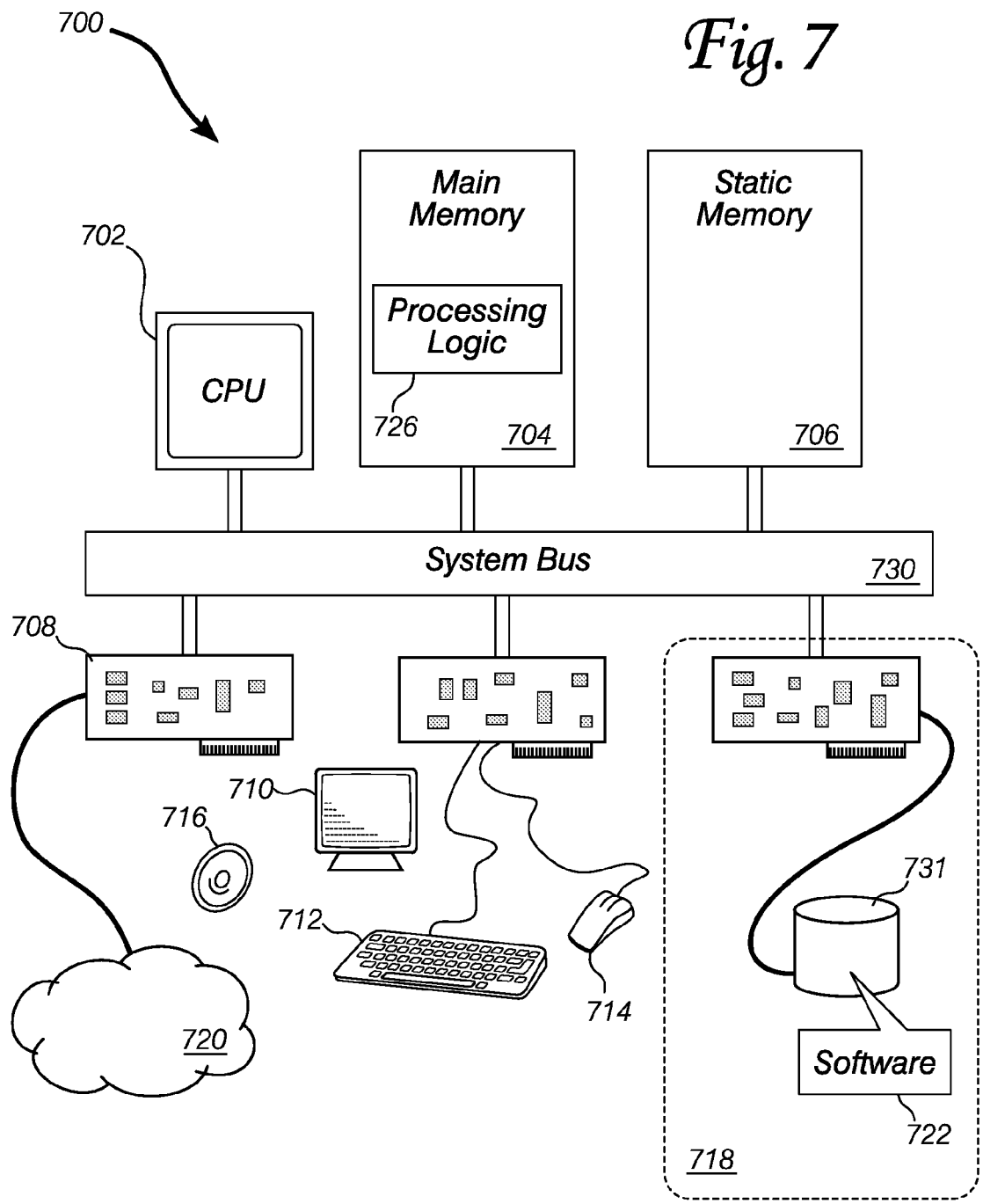
FIG. 7 shows a computer system that can implement an embodiment of the invention.

FIG. 7 illustrates a diagrammatic representation of a machine in the exemplary form of a computer system 700 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-readable storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processing device 702 during execution thereof by the computer system 700, the main memory 704 and the processing device 702 also constituting machine-readable storage media. The software 722 may further be transmitted or received over a network 720 via the network interface device 708.

The machine-readable storage medium 731 may also be used to store a dispatcher and/or application manager, and/or a software library containing methods that call management applications and/or dispatchers. While the machine-readable storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

An embodiment of the invention may be a machine-readable medium having stored thereon data and instructions (software) to cause a programmable processor to perform operations as described above. In other embodiments, the operations might be performed by specific hardware components that contain hardwired logic. Those operations might alternatively be performed by any combination of programmed computer components and custom hardware components.

Figure 8:
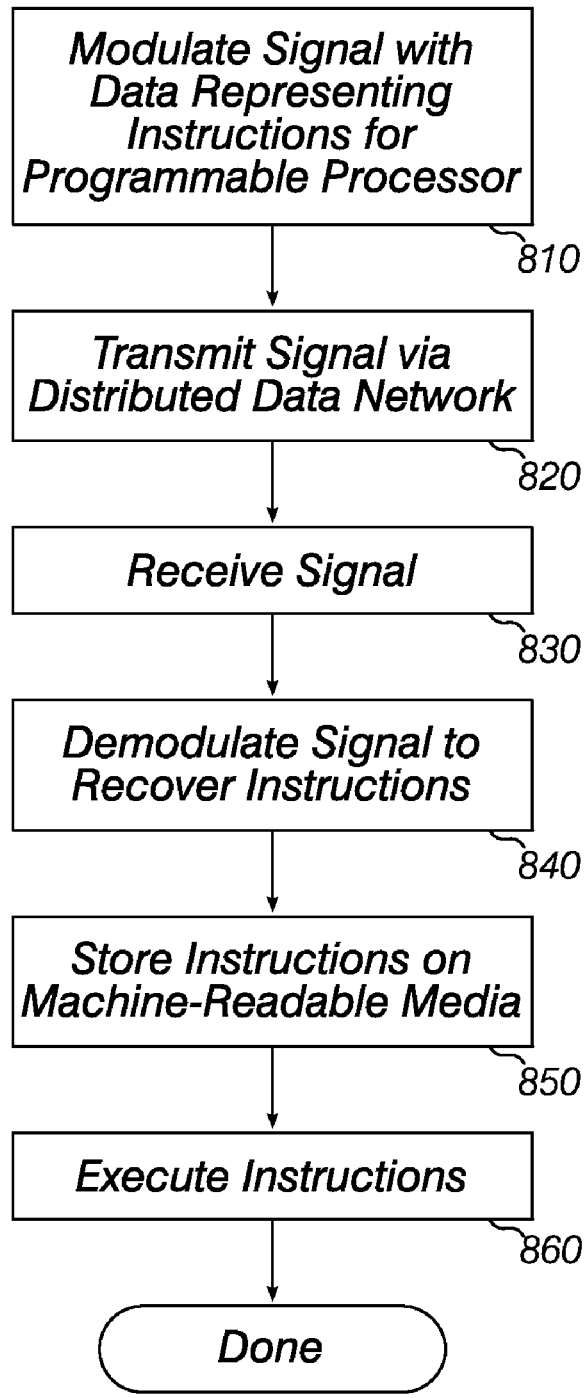
FIG. 8 shows how an embodiment of the invention can be encoded and transmitted across a data distribution network.

In some embodiments, the instructions for a programmable processor may be treated as data and manipulated as described in FIG. 8. At a first station, a carrier signal is modulated to encode data representing the instructions for a programmable processor (810). The modulated, data-bearing signal is transmitted over a distributed data network (820) such as the Internet, where it is received by a second station (830). The signal is demodulated to recover the data representing instructions for a programmable processor (840), and those instructions are saved on one or more machine-readable media (850). Finally, a programmable processor at the second station executes the instructions (860) to cause the second station to perform operations according to an embodiment of the invention. In the vernacular, such modulation and transmission are known as "serving" the instructions, while receiving and demodulating are often called "downloading." In other words, one embodiment "serves" (i.e., encodes and sends) the instructions of an embodiment to a client, often over a distributed data network like the Internet. The instructions thus transmitted can be saved on a hard disk or other data storage device at the receiver to create another embodiment of the invention, meeting the description of a machine-readable medium storing data and instructions to perform some of the operations discussed above. Executing such an embodiment at the receiver may result in the receiver performing operations according to a third embodiment.

Instructions for a programmable processor may be stored in a form that is directly executable by the processor ("object" or "executable" form), or the instructions may be stored in a human-readable text form called "source code" that can be automatically processed by a development tool commonly known as a "compiler" to produce executable code. Instructions may also be specified as a difference or "delta" from a predetermined version of a basic source code. The delta (also called a "patch") can be used to prepare instructions to implement an embodiment of the invention, starting with a commonly-available source code package that does not contain an embodiment.

In the foregoing description, numerous details were set forth. It will be apparent, however, to one skilled in the art, that the present invention may be practiced without these specific details. In some instances, well-known structures and devices were shown in block diagram form, rather than in detail, in order to avoid obscuring the present invention.

Some portions of the detailed descriptions were presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the foregoing discussion, it is appreciated that throughout the description, discussions utilizing terms such as "sending," "receiving," "attaching," "forwarding," "caching," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention was not described with reference to any particular programming language. It will be appreciated that a variety of programming languages may be used to implement the teachings of the invention as described herein.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The applications of the present invention have been described largely by reference to specific examples and in terms of particular allocations of functionality to certain hardware and/or software components. However, those of skill in the art will recognize that the performance (compression ratio) of adaptive coding compression algorithms can be improved by software and hardware that distribute the functions of embodiments of this invention differently than herein described. Such variations and implementations are understood to be captured according to the following claims.

I claim:

1. A computer-implemented method comprising:
   initializing a probability model so that the probability model can encode an escape token;
   encoding a series of input symbols using the probability model to produce a series of output symbols, wherein each output symbol represents either one input symbol or the escape token;
   collecting a plurality of input symbols that were encoded by the escape token to form a plurality of literals;

compressing the plurality of literals; and
outputting the compressed plurality of literals contiguously at a discernible location relative to the series of output symbols.

2. The computer-implemented method of claim 1 wherein the discernible location is ahead of the series of output symbols.

3. The computer-implemented method of claim 1 wherein the discernible location is after the series of output symbols.

4. The computer-implemented method of claim 1 wherein compressing the plurality of literals is using a property of decreasing numbers of unseen literals to reduce a number of bits devoted to representing the plurality of literals.

5. The computer-implemented method of claim 1, further comprising:
updating the probability model after encoding each input symbol.

6. The computer-implemented method of claim 1, further comprising:
reading the input symbols from an input data file.

7. The computer-implemented method of claim 1, further comprising:
storing the output symbols and the compressed plurality of literals in a compressed data file.

8. A machine-readable medium storing data and instructions to cause a programmable processor to perform operations comprising:
compressing an input data stream using an entropy coding compressor;
separating literal values from an output stream of the entropy coding compressor;
compressing the literal values separately; and
storing the compressed literal values at one end of the output stream of the entropy coding compressor.

9. The machine-readable medium of claim 8, wherein the compressed literal values are stored before a beginning of the output stream.

10. The machine-readable medium of claim 8, wherein the compressed literal values are stored after an end of the output stream.

11. The machine-readable medium of claim 8, wherein compressing the literal values reduces a size of the literal values to less than or equal to 212 eight-bit bytes.

12. The machine-readable medium of claim 8, wherein compressing the literal values reduces a size of the literal values to less than or equal to 1,692 bits.

13. A computer-implemented method comprising:
initializing a probability model so that the probability model can decode an escape token;
locating a compressed plurality of literals from a compressed data stream;
decompressing the compressed plurality of literals to produce a plurality of literals;
reading a plurality of bits from the compressed data stream;
decoding the plurality of bits to recover one of an input symbol or the escape token;
if an input symbol was recovered, outputting the input symbol;
if the escape token was recovered, outputting one of the plurality of literals; and
updating the probability model according to the input symbol or the one of the plurality of literals.

14. The computer-implemented method of claim 13 wherein the plurality of bits from the compressed data stream contains a variable number of bits.

15. The computer-implemented method of claim 13 wherein the plurality of bits from the compressed data stream encodes the input symbol or the escape token and part of another input symbol or another escape token.

16. The computer-implemented method of claim 13 wherein each input symbol and each literal of the plurality of literals contains an identical number of bits.

17. The computer-implemented method of claim 13 wherein each input symbol and each literal of the plurality of literals contains eight (8) bits.

18. A machine-readable medium storing data and instructions to cause a programmable processor to perform operations comprising:
reading a first series of data bits in a forwards direction from a beginning of a compressed data file;
reading a second series of data bits in a backwards direction from an end of the compressed data file;
decoding a first plurality of data bits from the first series of data bits to produce one of a source data byte or an escape token;
if the first plurality of data bits produces a source data byte, outputting the source data byte;
if the first plurality of data bits produces an escape token, decompressing a second plurality of data bits from the second series of data bits to produce a literal, and outputting the literal.

19. The machine-readable medium of claim 18, storing additional data and instructions to cause the programmable processor to perform operations comprising:
updating a probability model to control the decoding operation.

20. The machine-readable medium of claim 18 wherein the escape token indicates an escape from more than one coding context.

* * * * *